United States Patent
Tobayashi

(10) Patent No.: US 11,705,828 B2
(45) Date of Patent: Jul. 18, 2023

(54) POWER CONVERSION DEVICE

(71) Applicant: TOSHIBA MITSUBISHI-ELECTRIC INDUSTRIAL SYSTEMS CORPORATION, Chuo-ku (JP)

(72) Inventor: Shunsuke Tobayashi, Tokyo (JP)

(73) Assignee: TOSHIBA MITSUBISHI-ELECTRIC INDUSTRIAL SYSTEMS CORPORATION, Chuo-ku (JP)

(*) Notice: Subject to any disclaimer, the term of this patent is extended or adjusted under 35 U.S.C. 154(b) by 974 days.

(21) Appl. No.: 16/494,965

(22) PCT Filed: Nov. 20, 2018

(86) PCT No.: PCT/JP2018/042839
§ 371 (c)(1),
(2) Date: Sep. 17, 2019

(87) PCT Pub. No.: WO2020/105121
PCT Pub. Date: May 28, 2020

(65) Prior Publication Data
US 2021/0075337 A1    Mar. 11, 2021

(51) Int. Cl.
*H02P 27/06*    (2006.01)
*H02M 7/487*    (2007.01)
(Continued)

(52) U.S. Cl.
CPC .......... *H02M 7/487* (2013.01); *G01R 31/42* (2013.01); *H02P 27/06* (2013.01); *H04Q 9/00* (2013.01); *H04Q 2209/84* (2013.01)

(58) Field of Classification Search
CPC ......... H02M 7/487; H02P 27/06; G01R 31/42
See application file for complete search history.

(56) References Cited

U.S. PATENT DOCUMENTS 5,170,769 A    12/1992  Berger et al.
8,618,692 B2 * 12/2013  Adest .................. H02J 7/00
                                                    307/58
(Continued)

FOREIGN PATENT DOCUMENTS

JP    2007-306758 A    11/2007
JP    2017-135918 A     8/2017
JP    2018-113792 A     7/2018

OTHER PUBLICATIONS

European Office Action dated Jul. 22, 2021 in European Patent Application No. 18910235.3, 8 pages.
(Continued)

*Primary Examiner* — Rina Duda
(74) *Attorney, Agent, or Firm* — Oblon, McClelland, Maier & Neustadt, L.L.P.

(57) ABSTRACT

A power conversion device according to an embodiment includes a cell, a first sensor, a second sensor, a storage, a first controller, and a second controller. The first controller is configured to control or protect the cell on the basis of at least one of an output result of the first sensor and an output result of the second sensor. The second controller, in a case in which a change in at least one of the output result of the first sensor and the output result of the second sensor satisfies a first condition, is configured to execute at least one of a first operation of storing the output result of the first sensor in the storage, a second operation of storing the output result of the first sensor in the storage over a second period longer than a first period, and a third operation of storing the output result of the second sensor instead of the output result of the first sensor.

13 Claims, 7 Drawing Sheets

(51) Int. Cl.
 *H04Q 9/00* (2006.01)
 *G01R 31/42* (2006.01)

(56) References Cited

U.S. PATENT DOCUMENTS

| | | | | |
|---|---|---|---|---|
| 2013/0154529 A1* | 6/2013 | Kasunich | .................. | H02P 6/34 |
| | | | | 318/400.21 |
| 2015/0234714 A1 | 8/2015 | Tsuchida et al. | | |
| 2016/0111953 A1* | 4/2016 | Chae | ....................... | H02M 1/36 |
| | | | | 318/503 |
| 2016/0359424 A1* | 12/2016 | Tran | ....................... | H02H 3/162 |

OTHER PUBLICATIONS

Anonymous, "Circular buffer—Wikipedia," Retrieved from the Internet on Jul. 16, 2021 [URL: https://en.wikipedia.org/w/index.php?title=Circular_buffer&oldid=862395106], XP055825125, Oct. 4, 2018, 5 pages.
International Search Report dated Jan. 29, 2019 in PCT/JP2018/042839 filed Nov. 20, 2018.
Extended European Search Report dated Oct. 5, 2020 in corresponding European Patent Application No. 18910235.3, 8 pages.
Office Action dated Dec. 8, 2022, in corresponding European Patent Application No. 18 910 235.3, 12 pages.

* cited by examiner

FIG. 6

| ID | SIGNAL SUPPLY SOURCE | MEASUREMENT TARGET/CONTROL TARGET | ACQUISITION INTERVAL | STORAGE TIME |
|---|---|---|---|---|
| 1 | INPUT TRANSFORMER 5 | AC POWER SUPPLY PS VOLTAGE (FIRST PHASE) | 5kHz | 500ms |
| 2 | INPUT TRANSFORMER 5 | AC POWER SUPPLY PS VOLTAGE (SECOND PHASE) | 5kHz | 500ms |
| 3 | INPUT TRANSFORMER 5 | AC POWER SUPPLY PS VOLTAGE (THIRD PHASE) | 5kHz | 500ms |
| 4 | INPUT TRANSFORMER 5 | INPUT CURRENT (FIRST PHASE) | 5kHz | 500ms |
| 5 | INPUT TRANSFORMER 5 | INPUT CURRENT (SECOND PHASE) | 5kHz | 500ms |
| 6 | INPUT TRANSFORMER 5 | INPUT CURRENT (THIRD PHASE) | 5kHz | 500ms |
| 7 | LOAD L | INVERTER OUTPUT CURRENT (FIRST PHASE) | 5kHz | 500ms |
| 8 | LOAD L | INVERTER OUTPUT CURRENT (SECOND PHASE) | 5kHz | 500ms |
| 9 | LOAD L | INVERTER OUTPUT CURRENT (THIRD PHASE) | 5kHz | 500ms |
| 10 | SINGLE-PHASE CELL UNIT 6 | INPUT CURRENT | 5kHz | 500ms |
| 11 | SINGLE-PHASE CELL UNIT 6 | DC VOLTAGE | 5kHz | 500ms |
| 12 | SINGLE-PHASE CELL UNIT 6 | CONVERTER GATE PULSE 1 (REPEATEDLY) | 10kHz | 100ms |
| 13 | SINGLE-PHASE CELL UNIT 6 | CONVERTER GATE PULSE 2 (REPEATEDLY) | 10kHz | 100ms |
| 14 | SINGLE-PHASE CELL UNIT 6 | CONVERTER GATE PULSE 3 (REPEATEDLY) | 10kHz | 100ms |
| 15 | SINGLE-PHASE CELL UNIT 6 | CONVERTER GATE PULSE 4 (REPEATEDLY) | 10kHz | 100ms |
| 16 | SINGLE-PHASE CELL UNIT 6 | INVERTER GATE PULSE 1 (REPEATEDLY) | 10kHz | 100ms |
| 17 | SINGLE-PHASE CELL UNIT 6 | INVERTER GATE PULSE 2 (REPEATEDLY) | 10kHz | 100ms |
| 18 | SINGLE-PHASE CELL UNIT 6 | INVERTER GATE PULSE 3 (REPEATEDLY) | 10kHz | 100ms |
| 19 | SINGLE-PHASE CELL UNIT 6 | INVERTER GATE PULSE 4 (REPEATEDLY) | 10kHz | 100ms |
| 20 | SINGLE-PHASE CELL UNIT 6 | CELL UNIT SUBSTRATE POWER SUPPLY | 10kHz | 100ms |
| 21 | CONTROL DEVICE 7 | SPEED INSTRUCTION | 1kHz | 2500ms |
| 22 | CONTROL DEVICE 7 | RESOLVER OUTPUT (SPEED FEEDBACK) | 1kHz | 2500ms |
| 23 | CONTROL DEVICE 7 | ELECTRIC MOTOR ELECTRIC ANGLE | 5kHz | 500ms |
| 24 | CONTROL DEVICE 7 | TORQUE INSTRUCTION | 1kHz | 2500ms |
| 25 | CONTROL DEVICE 7 | CONVERTER CURRENT INSTRUCTION | 1kHz | 2500ms |
| 26 | CONTROL DEVICE 7 | INVERTER CURRENT INSTRUCTION | 1kHz | 2500ms |
| 27 | CONTROL DEVICE 7 | CONVERTER VOLTAGE INSTRUCTION | 1kHz | 2500ms |
| 28 | CONTROL DEVICE 7 | INVERTER VOLTAGE INSTRUCTION | 1kHz | 2500ms |
| 29 | CONTROL DEVICE 7 | CONVERTER GATE PULSE 1 | 1kHz | 2500ms |
| 30 | CONTROL DEVICE 7 | CONVERTER GATE PULSE 2 | 1kHz | 2500ms |
| 31 | CONTROL DEVICE 7 | CONVERTER GATE PULSE 3 | 1kHz | 2500ms |
| 32 | CONTROL DEVICE 7 | CONVERTER GATE PULSE 4 | 1kHz | 2500ms |
| 33 | CONTROL DEVICE 7 | INVERTER GATE PULSE 1 | 1kHz | 2500ms |
| 34 | CONTROL DEVICE 7 | INVERTER GATE PULSE 2 | 1kHz | 2500ms |
| 35 | CONTROL DEVICE 7 | INVERTER GATE PULSE 3 | 1kHz | 2500ms |
| 36 | CONTROL DEVICE 7 | INVERTER GATE PULSE 4 | 1kHz | 2500ms |
| 37 | CONTROL DEVICE 7 | CONTROL CIRCUIT POWER SUPPLY VOLTAGE | 1kHz | 2500ms |
| 38 | TEMPERATURE SENSOR TM1 | HEAT SINK TEMPERATURE | 1Hz | 1250s |
| 39 | TEMPERATURE SENSOR TM2 | POWER CONVERSION DEVICE ENTRANCE TEMPERATURE | 1Hz | 1250s |
| 40 | TEMPERATURE SENSOR TM3 | POWER CONVERSION DEVICE EXIT TEMPERATURE | 1Hz | 1250s |
| 41 | TEMPERATURE SENSOR TM4 | INPUT BUS TEMPERATURE | 1Hz | 1250s |
| 42 | TEMPERATURE SENSOR TM5 | OUTPUT BUS TEMPERATURE | 1Hz | 1250s |

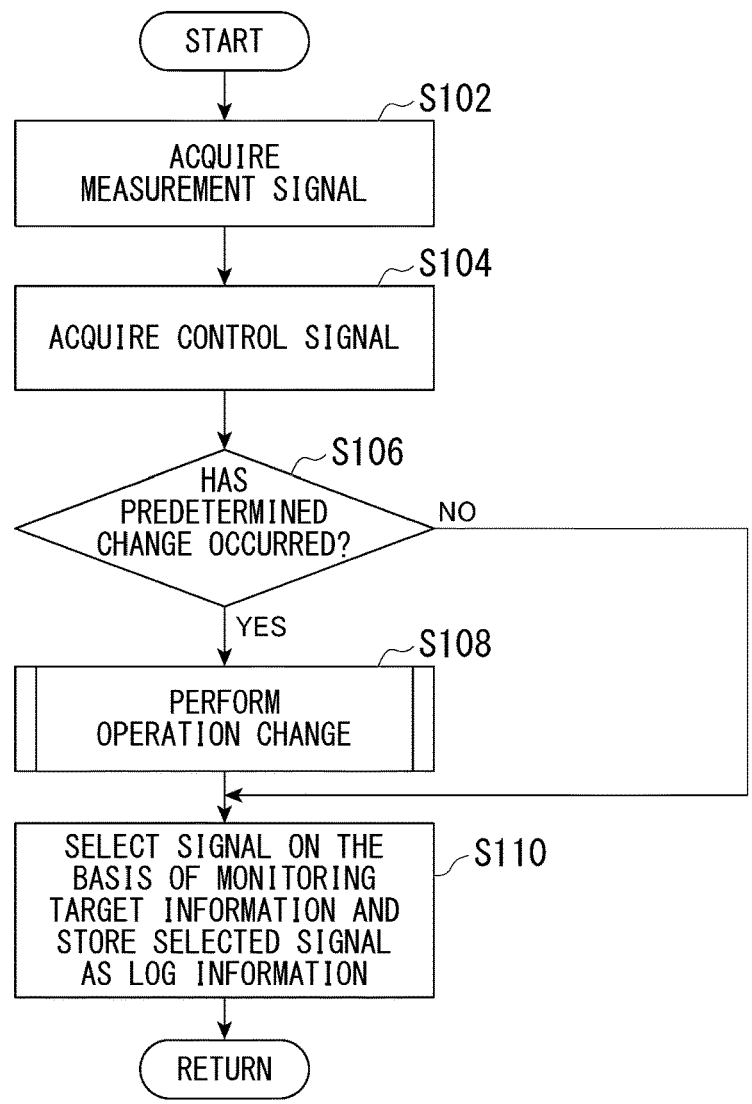

POWER CONVERSION DEVICE

TECHNICAL FIELD

An embodiment of the present invention relates to a power conversion device.

BACKGROUND ART

Conventionally, technologies relating to a storage control device that stores measurement signals acquired by measuring a voltage, a current, a temperature, and the like of a power conversion device and control signals output from a control device for effectively using the signals for probing into causes of a malfunction occurring in a target device (for example, the power conversion device) controlled by the control device are known.

Here, information stored in the storage control device is information enabling checking of a state of a monitoring target going back to a longer time from the time of occurrence of a malfunction, and it is preferable to store more information therein. However, the amount of information that can be stored by a storage control device depends on the capacity of a storage included in the storage control device, and accordingly, it is difficult to store all the information over a long time in a power conversion device composed of a plurality of cell units.

CITATION LIST

Patent Literature

[Patent Document I]
Japanese Unexamined Patent Application, First Publication No. 2007-306758

SUMMARY OF INVENTION

Technical Problem

An object to be achieved by the present invention is to provide a power conversion device capable of collecting appropriate information by probing into causes of a malfunction that has occurred.

Solution to Problem

A power conversion device according to an embodiment includes a cell unit, a first sensor, a second sensor, a storage, a first controller, and a second controller. The cell unit converts power between DC power and AC power.

The first sensor is disposed in the cell unit and is configured to measure a value relating to first monitoring item of the cell unit. The second sensor is disposed in the cell unit and is configured to measure a value relating to second monitoring details of the cell unit. The first controller monitors an output result of the first sensor and an output result of the second sensor and is configured to control or protect the cell unit on the basis of at least one of the output result of the first sensor and the output result of the second sensor. The second controller, in a case in which the cell unit is in a first state, is configured to store the output result of the first sensor measured at a first sampling cycle in the storage over at least a first period without storing the output result of the second sensor in the storage and, in a case in which the cell unit transitions to a second state in which a change in at least one of the output result of the first sensor and the output result of the second sensor satisfies a first condition, execute at least one of a first operation of storing the output result of the first sensor measured at a second sampling cycle shorter than the first sampling cycle in the storage, a second operation of storing the output result of the first sensor in the storage over a second period longer than the first period, and a third operation of storing the output result of the second sensor in the storage instead of the output result of the first sensor.

BRIEF DESCRIPTION OF DRAWINGS

FIG. 6 is a diagram showing one example of details of monitoring target information according to an embodiment.

FIG. 7 is a diagram showing one example of details of log information according to an embodiment.

FIG. 8 is a flowchart showing one example of an operation of a storage control device according to an embodiment.

DESCRIPTION OF EMBODIMENTS

Figure 1:
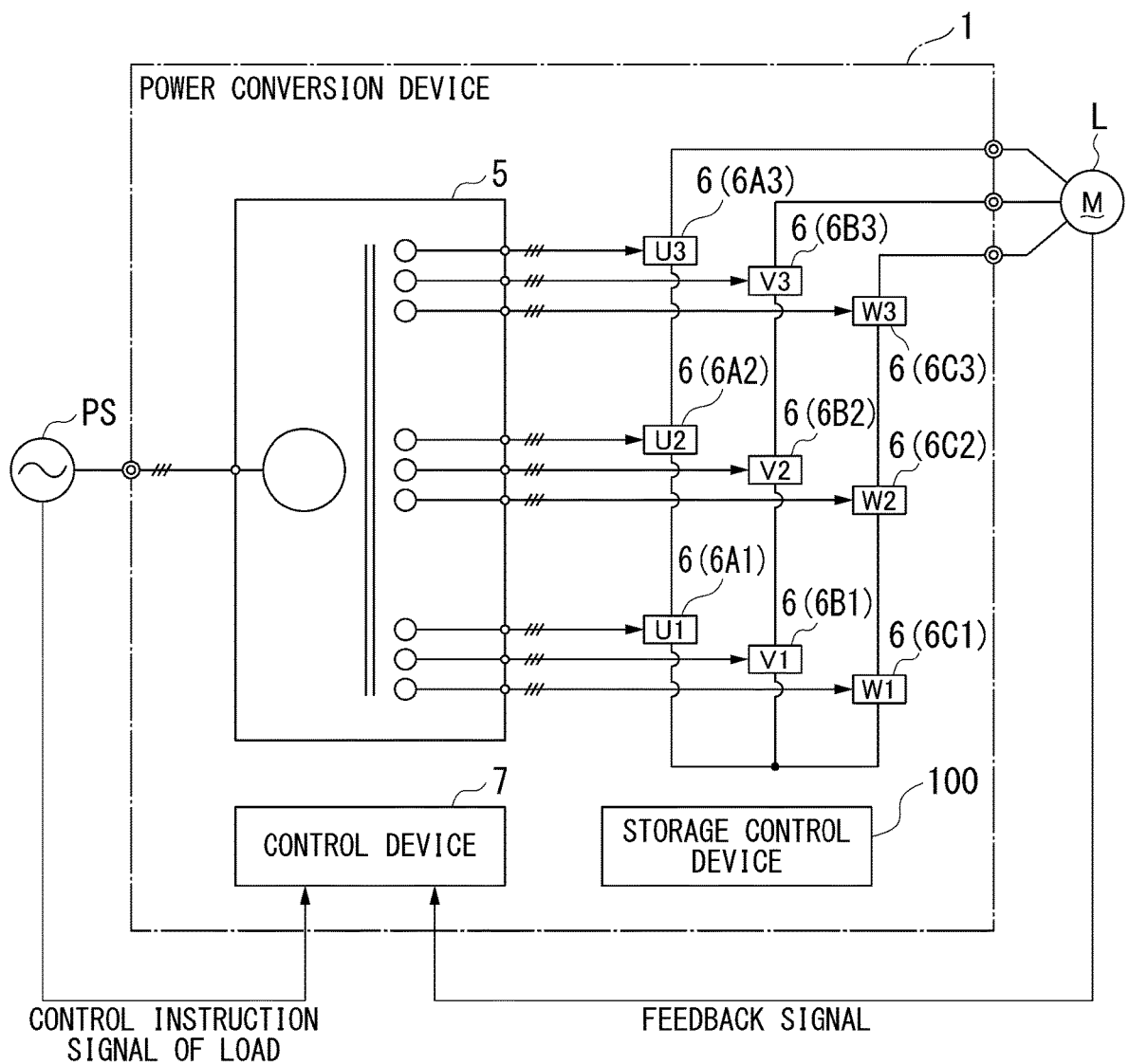
FIG. 1 is a diagram showing one example of a power conversion device according to an embodiment.

Hereinafter, a power conversion device according to an embodiment will be described with reference to the drawings. In addition, in the following description, the same reference signs will be assigned to components having the same functions or functions similar to each other. Duplicate description of such components may be omitted. In the drawings to be referred to below, for convenience of description, a gate wiring for control and the like may not be shown.

Here, a "positive electrode P," a "negative electrode N," and a "neutral point C" will be defined first. The "positive electrode P" represents a part having a positive electric potential in a case in which a power conversion device 1 operates. The "negative electrode N" represents a part having a negative electric potential in a case in which a power conversion device 1 operates. The "neutral point C" represents a part having an intermediate electric potential (neutral point electric potential) between the positive electrode P and the negative electrode N in the power conversion device 1 of a neutral point clamp type (NPC type) in a case in which the power conversion device 1 operates.

The power conversion device 1 according to an embodiment will be described with reference to FIGS. 1 to 9. The power conversion device 1, for example, converts AC power supplied from an AC power supply PS into DC power, converts the converted DC power into AC power having a desired frequency and a desired voltage, and supplies resultant power to a load L. The load L, for example, is an electric motor but is not limited thereto. In this embodiment, an example in which the power conversion device 1 includes a plurality of cell units 6 will be described. In addition, the power conversion device 1 may include a three-phase converter and a three-phase inverter instead of the plurality of cell units 6.

<1. Electrical Configuration>
<1.1 Entire Configuration>

First, the entire electrical configuration of the power conversion device 1 will be described. FIG. 1 is a diagram showing one example of the power conversion device 1. In FIG. 1, an electric circuit system is represented using a single line, and a switch and the like are not shown. The power conversion device 1, for example, includes an input transformer 5, a plurality of cell units 6, and a control device 7.

AC power is supplied from an AC power supply PS to the input transformer 5. The input transformer 5 converts the AC power supplied from the AC power supply PS into a desired voltage and supplies the converted AC power to the plurality of cell units 6. A secondary side of the input transformer 5 includes a plurality of groups of coils that are insulated from each other.

Each cell unit 6 converts AC power of three phases supplied from a secondary wiring of the input transformer 5 into DC power, converts the converted DC power into AC power having a desired frequency and a desired voltage, and outputs the converted AC power. In this embodiment, the plurality of cell units 6 include three cell units 6A1, 6A2, and 6A3 of a load first phase, three cell units 6B1, 6B2, and 6B3 of a load second phase, and three cell units 6C1, 6C2, and 6C3 of a load third phase.

Each of the cell units has the same circuit configuration. A secondary-side first group of the input transformer 5 is connected to an input of the cell unit 6A1. A secondary-side second group of the input transformer 5 is connected to an input of a cell unit V1. A secondary-side third group of the input transformer 5 is connected to an input of a cell unit W1. A secondary-side fourth group of the input transformer 5 is connected to an input of the cell unit 6A2. A secondary-side fifth group of the input transformer 5 is connected to an input of the cell unit 6B2. A secondary-side sixth group of the input transformer 5 is connected to an input of the cell unit 6C2. A secondary-side seventh group of the input transformer 5 is connected to an input of the cell unit 6A3. A secondary-side eighth group of the input transformer 5 is connected to an input of the cell unit 6B3. A secondary-side ninth group of the input transformer 5 is connected to an input of the cell unit 6C3.

In this embodiment, outputs of the cell units 6A1, 6A2, and 6A3 are electrically connected in series in this order. An output terminal of the cell unit 6A3 that is not connected to the cell unit 6A2 is connected to a first phase of a load L. An output terminal of the cell unit 6A1 that is not connected to the cell unit 6A2 is connected to a neutral point. In this embodiment, outputs of the cell units 6B1, 6B2, and 6B3 are electrically connected in series in this order. An output terminal of the cell unit 6B3 that is not connected to the cell unit 6B2 is connected to a third phase of the load L. An output terminal of the cell unit 6B1 that is not connected to the cell unit 6B2 is connected to the neutral point. In this embodiment, outputs of the cell units 6C1, 6B2, and 6B3 of the third phase are electrically connected in series in this order. An output terminal of the cell unit 6C3 that is not connected to the cell unit 6C2 is connected to the third phase of the load L. An output terminal of the cell unit 6C1 that is not connected to the cell unit 6C2 is connected to a neutral point. In this way, the power conversion device 1 can supply a large capacity of AC power to the load L.

The control device 7 controls or protects a plurality of cell units 6. For example, the control device 7 controls each cell unit 6 by transmitting a control signal used for controlling a switching element included in each cell unit 6 on the basis of information representing a voltage of AC power supply PS from a voltage sensor not shown in the drawing, information representing a DC voltage or an input current of each cell unit detected by a voltage sensor VM (not shown in FIG. 1) or a current sensor AM (not shown in FIG. 1), and information representing a current output from a current sensor detecting a current output from the power conversion device 1 not shown in the drawing to the load L. In addition, the control device 7 acquires a signal representing a control state of the load L (for example, a feedback signal of the number of revolutions) and controls each cell unit 6 on the basis of the feedback signal. In addition, the control device 7 acquires a control instruction signal of the load L from another device and controls each cell unit 6 on the basis of the control instruction signal. The control device 7 is one example of a "first controller."

<1.2 Cell Unit>

Next, the cell unit 6 will be described. Here, aside from their external connections, the cell units 6A1, 6A2, 6A3, 6B1, 6B2, 6B3, 6C1, 6C2, and 6C3 have approximately the same internal structures. For this reason, hereinafter, the first cell unit 6A1 will be described as a representative.

Figure 2:
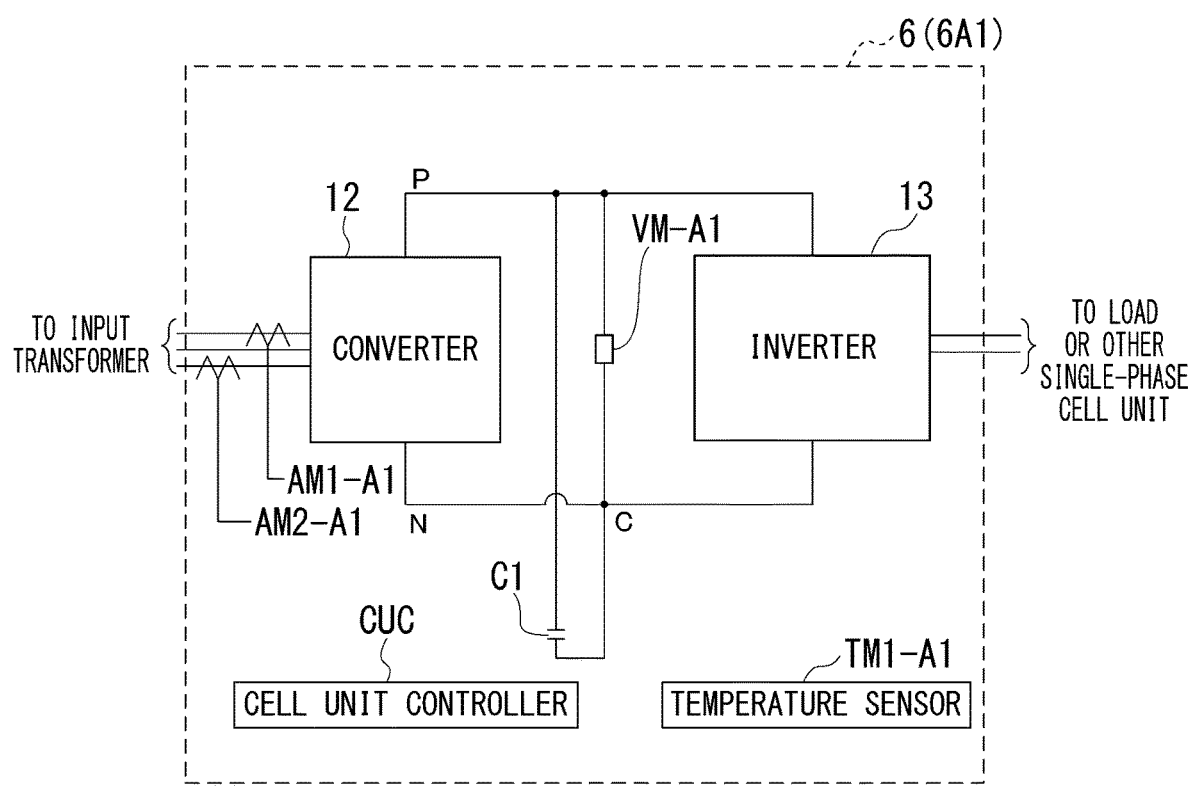
FIG. 2 is a diagram showing a cell unit according to an embodiment.

FIG. 2 is a diagram showing the first cell unit 6A1. The first cell unit 6A, for example, includes a converter 12, an inverter 13, a capacitor C1, a current sensor AM1-A1, a current sensor AM2-A1, a cell unit controller CUC, a temperature sensor TM1-A1, and a voltage sensor VM-A1. Positive electrodes (P) of the converter 12 and the inverter 13 are electrically connected, and negative electrodes (N) thereof are electrically connected. Terminals of the capacitor C1 are electrically connected to the positive electrodes and the negative electrode.

Here, a sign (for example, A1 to A3, B1 to B3, and C1 to C3) used for identifying a cell unit 6 is added to the end of each component included in the cell unit 6. For example, a component having "-A1" added to the end of its sign represents a component relating to the first cell unit 6A1, and a component having "-B1" added to the end of its sign represents a component relating to the cell unit 6B1 of the second phase. This similarly applies to the other cell units 6. In addition, in a case in which a cell unit 6 to which a specific component relates does not need to be differentiated, a sign used for identifying the cell unit 6 will be omitted.

The converter 12 is a three-phase converter, and an input unit thereof is electrically connected to one group of the secondary side of the input transformer 5. The converter 12 converts AC power input from the input transformer 5 into DC. In addition, in the input unit of the converter 12, a current sensor AM1-A1 used for detecting an input current input from the input transformer 5 to the converter 12 is disposed at the first phase of an AC input, and a current sensor AM2-A1 is disposed at the third phase of the AC input. A second-phase current of the AC input can be acquired on the basis of values of the current sensor AM1-A1 and the current sensor AM2-A1 and thus may be omitted. The capacitor C1 smooths a DC voltage after conversion. The voltage sensor VM is connected to both ends of the capacitor C1. The voltage sensor VM-A1 detects a terminal voltage of the capacitor, in other words, a DC voltage of the cell unit 6A1. In addition, in a case in which the current sensor AM1 and the current sensor AM2 do not need to be differentiated from each other, each may be simply referred to as a current sensor AM.

The inverter 13 is a single-phase inverter, and an output thereof is electrically connected to another cell unit 6. The inverter 13, for example, outputs a first phase of AC power after conversion to the load L.

A gate pulse signal from the control device 7 is given to switching elements configuring the converter 12 and the inverter 13 through a cell unit controller CUC.

Each of the converter 12 and the inverter 13 is composed of a plurality of switching elements, such switching elements are densely combined with a heat sink not shown in the drawing, heat generated by the switching elements is dissipated using the heat sink, and the temperatures of the switching elements are configured to be maintained at a temperature that is equal to or lower than a predetermined value. In addition, a temperature sensor TM1 used for detecting the temperature of the heat sink is disposed in the heat sink.

A DC voltage of the cell unit 6A1 detected by the voltage sensor VM-A1 is transmitted to the control device 7 and the storage control device 100 through the cell unit controller CUC. Input currents of the cell unit 6A1 detected by the current sensor AM1-A1 and the current sensor AM2-A1 are transmitted to the control device 7 and the storage control device 100 through the cell unit controller CUC.

In addition, in the following description, "information representing a DC voltage measured by the voltage sensor VM that is a DC voltage of the cell unit" is another example of a measurement signal. In addition, a DC voltage of the cell unit measured by the voltage sensor VM is one example of a "monitoring target."

In the following description, "information representing an input current measured by the current sensor AM that is an input current of the cell unit" is another example of a measurement signal. In addition, an input current of the cell unit measured by the current sensor AM is one example of a "monitoring target."

In the following description, "information representing the temperature of the heat sink measured by the temperature sensor TM1 that is a heat sink temperature of the cell unit" is another example of a measurement signal. In addition, a heat sink temperature of the cell unit measured by the temperature sensor TM1 is one example of a "monitoring target."

<2. Physical Configuration>
<2.1 Entire Configuration>

Figure 3:
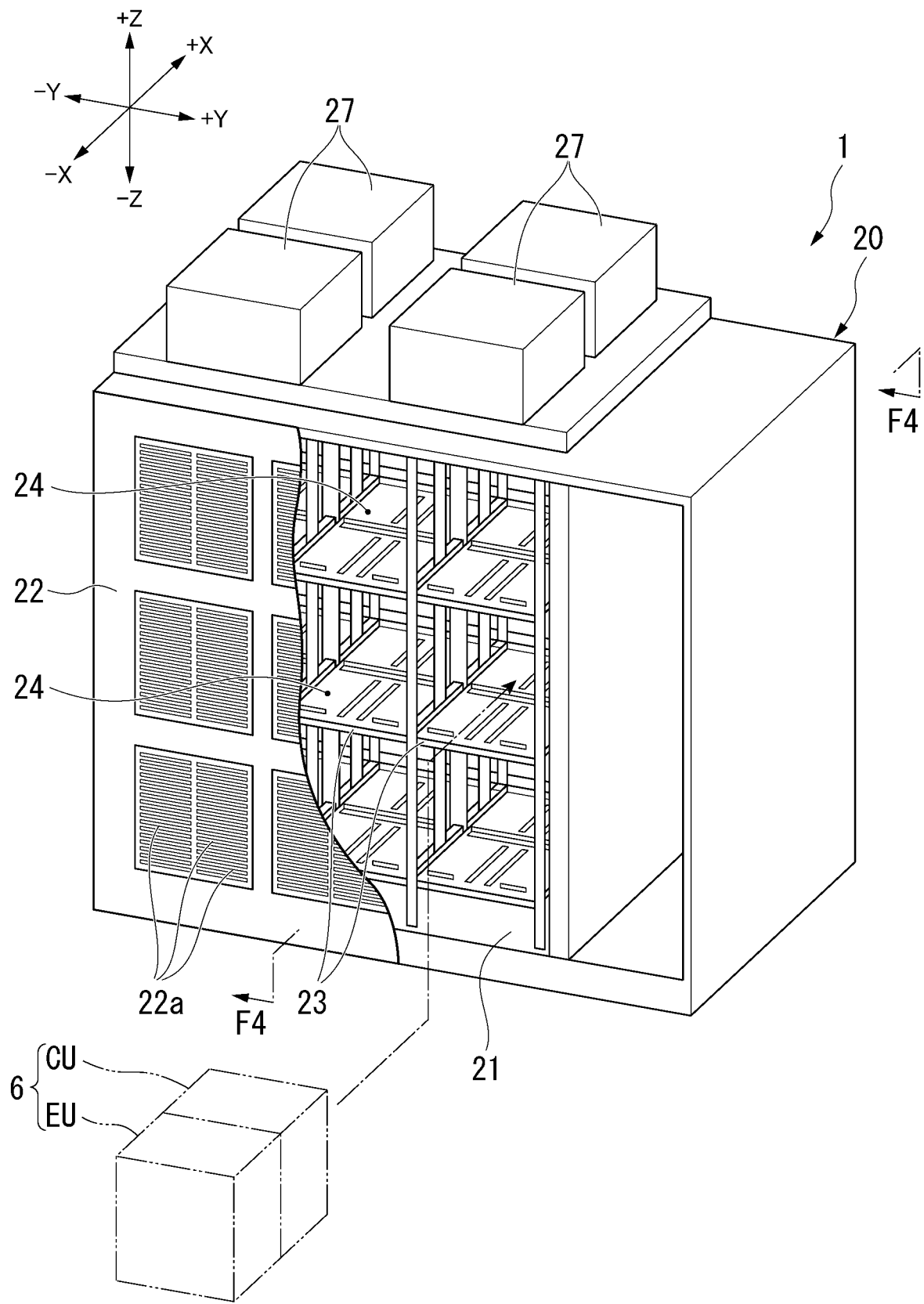
FIG. 3 is a perspective view showing one example of a power conversion device according to an embodiment.

Next, the physical configuration of the power conversion device 1 will be described. FIG. 3 is a perspective view showing one example of the power conversion device 1. Here, a +X direction, a −X direction, a +Y direction, a −Y direction, a +Z direction, and a −Z direction will be defined. The +X direction, the −X direction, the +Y direction, and the −Y direction are directions along an approximately horizontal plane. The +X direction is a direction from the front face to the rear face of the power conversion device 1. The −X direction is a direction opposite to the +X direction. In a case in which the +X direction and the −X direction do not need to be differentiated from each other, they will be simply referred to as an "X direction." The +Y direction and the −Y direction are directions that are different from (for example, approximately orthogonal to) the X direction. The +Y direction is a direction toward the right side when seen from in front of the front face of the power conversion device 1. The −Y direction is a direction opposite to the +Y direction. In a case in which the +Y direction and the −Y direction do not need to be differentiated from each other, they will be simply referred as a "Y direction." The +Z direction and the −Z direction are directions that are different from (for example, approximately orthogonal to) the X direction and the Y direction and are approximately vertical directions. The +Z direction is a direction toward the upper side. The −Z direction is a direction opposite to the +Z direction. In a case in which the +Z direction and the −Z direction do not need to be differentiated from each other, they will be simply referred as a "Z direction." The +X direction is one example of a "first direction." The +Y direction is one example of a "second direction." The −Y direction is one example of a "third direction."

The following description will focus on the installation structure of the cell unit 6. The power conversion device 1, for example, includes a casing 20, a plurality of cell units 6 (only one is shown in FIG. 3), and a plurality of fans 27.

The casing 20 is formed in a box shape. The casing 20 integrally houses the plurality of cell units 6. The casing 20, for example, includes an opening portion 21, a front-face cover 22, and a plurality of shelf boards 23.

The opening portion 21 opens in the −X direction. Here, the cell unit 6 includes a capacitor unit CU including a capacitor C1 and a unit including components other than the capacitor C1 (hereinafter referred to as an element unit EU). The element unit EU and the capacitor unit CU are inserted from the outside of the casing 20 into the inside of the casing 20 through the opening portion 21. The element unit EU is disposed near the opening portion 21 relative to the capacitor unit CU in a state in which the element unit EU and the capacitor unit CU are housed in the casing 20.

The front-face cover 22 closes the opening portion 21 to be openable. The front-face cover 22 includes a plurality of ventilation parts 22a that face the cell units 6. The air outside the casing 20 can flow into the inside of the casing 20 through the ventilation parts 22a.

The plurality of shelf boards 23 are disposed inside the casing 20. The plurality of shelf boards 23 are disposed to be divided into a plurality of stages (for example, three stages) in the Z direction. In addition, the plurality of shelf boards 23 are disposed to be divided into a plurality of columns (for example, three columns) in the Y direction in each stage in the Z direction. In this way, a plurality of (for example, a total of nine) housing parts 24 are formed inside the casing 20.

The plurality of cell units 6 are housed while being divided into the plurality of housing parts 24 inside the casing 20. Each cell unit 6 is placed on the shelf board 23 and is supported from the lower side by the shelf board 23. In this embodiment, the element unit EU and the capacitor unit CU are sequentially inserted from the outside of the casing 20 into the housing part 24 and are connected to each other after the insertion into the housing part 24.

The plurality of fans 27, for example, are disposed on top of the casing 20. Each fan 27 causes a wind to flow in a gap of the cell unit 6 (for example, a gap between the element unit EU and the capacitor unit CU).

Figure 4:
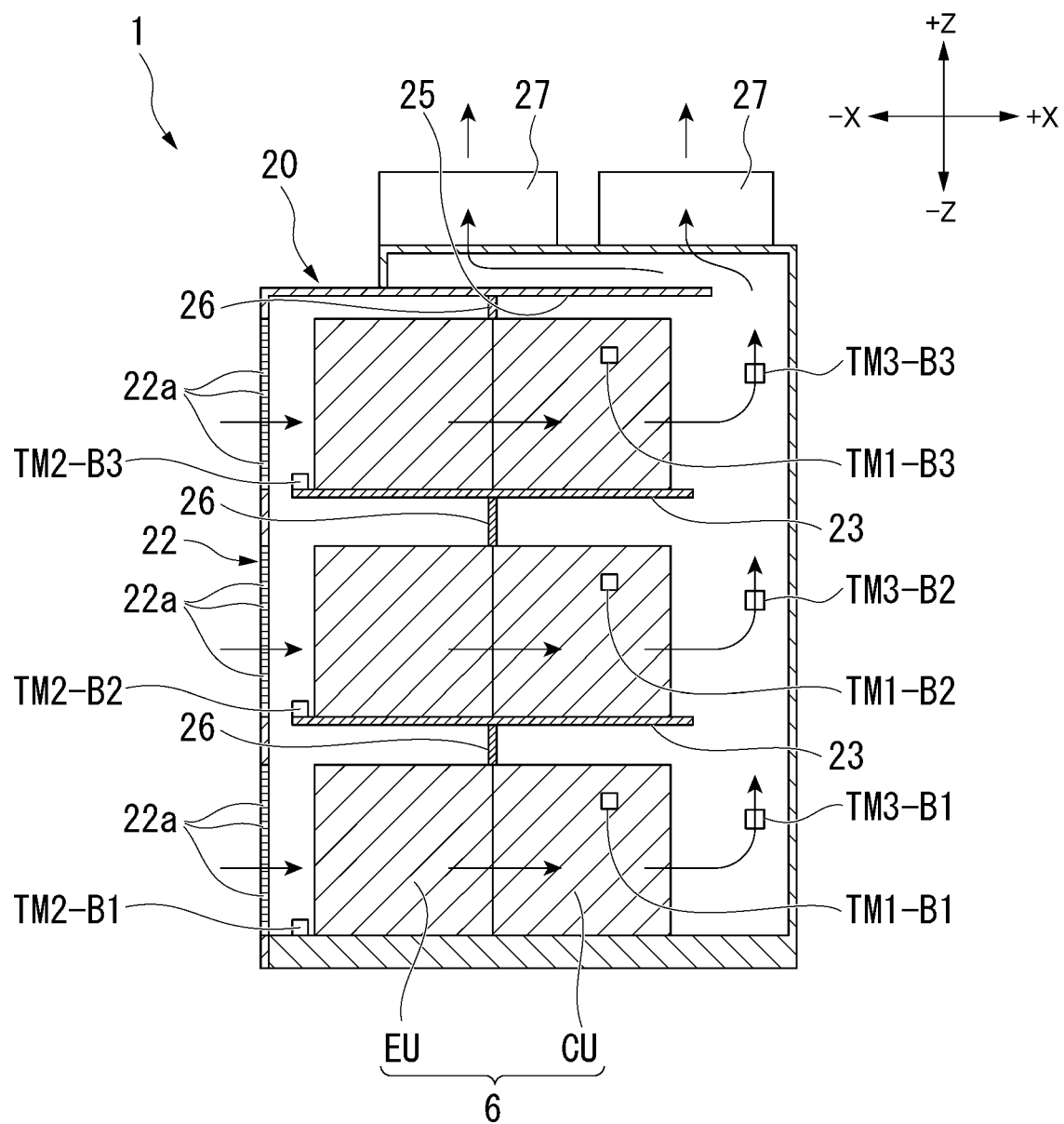
FIG. 4 is a cross-sectional view taken along a line F4-F4 of the power conversion device shown in FIG. 3.

FIG. 4 is a cross-sectional view along a line F4-F4 of the power conversion device 1 shown in FIG. 3. Inside the casing 20, a first partition member 25 and a plurality of second partition members 26 that define the flows of winds are disposed. The first partition member 25 is positioned on the upper side of the cell unit 6 disposed in the uppermost stage. The first partition member 25 is formed in a plate shape in the X direction and the Y direction. Each second partition member 26 is disposed between the cell unit 6 and the shelf board 23 positioned on the upper side thereof or between the cell unit 6 and the first partition member 25 positioned on the upper side thereof. The second partition member 26 is formed in a plate shape in the Y direction and the Z direction. The second partition member 26 closes a cooling passage between the cell unit 6 and the shelf board 23 positioned on the upper side thereof or between the cell unit 6 and the first partition member 25 positioned on the upper side thereof. For example, the second partition member 25 is disposed on the upper side of a connection part (boundary part) between the element unit EU and the capacitor unit CU. By employing the configuration described above, a cooling wind passes through cooling pins of the cell unit 6 and can effectively cool the cell unit 6.

In this embodiment, the plurality of fans 27 suck in the air of an inner part (an end part in the +X direction) of the casing 20 and discharge the sucked air to the outside of the casing 20. In this way, the air outside the casing 20 flows to the inside of the casing 20 through the ventilation part 22a of the front-face cover 22 of the casing 20. The air that has flowed into the inside of the casing 20 passes through the inside of the cell unit 6, thereby promoting heat dissipation of the cell unit 6. The air warmed when it passes through the inside of the cell unit 6 is discharged to the outside of the casing 20 in accordance with driving of the fan 27.

In addition, a temperature sensor TM detecting the temperature of the air that has flowed into the inside of the casing 20 is included in the casing 20. In the example shown in FIG. 4, the casing 20 includes the temperature sensors TM1-B1 to TM1-B3 described above, temperature sensors TM2-B1 to TM2-B3 each detecting the temperature of the air before it is warmed by the cell unit 6 (in other words, the entrance temperature of the power conversion device), and temperature sensors TM3-B1 to TM3-B3 each detecting the temperature of the air after it is warmed by the cell unit 6 (in other words, the exit temperature of the power conversion device). The storage control device 100 acquires information representing a heat sink temperature of the cell unit 6 that is measured by the temperature sensor TM. In the following description, "information representing a heat sink temperature of the cell unit 6" is another example of a measurement signal.

In addition, in the casing 20, a temperature sensor TM4 (not shown in the drawing) that detects a temperature of a bus of a point connected to the input transformer 5 (referred to as an input bus below) that is a temperature of a bus connecting various terminals of the converter 12 and the inverter 13 (hereinafter, referred to as an input bus) and a temperature sensor TM5 (not shown in the drawing) that detects a temperature of a bus of a point connected to the load L (hereinafter, referred to as an output bus) (in other words, an output bus temperature) that is a temperature of a bus connecting various terminals of the converter 12 and the inverter 13 are provided.

<3. Storage Control Device>
<3.1 Entire Configuration of Storage Control Device>

Figure 5:
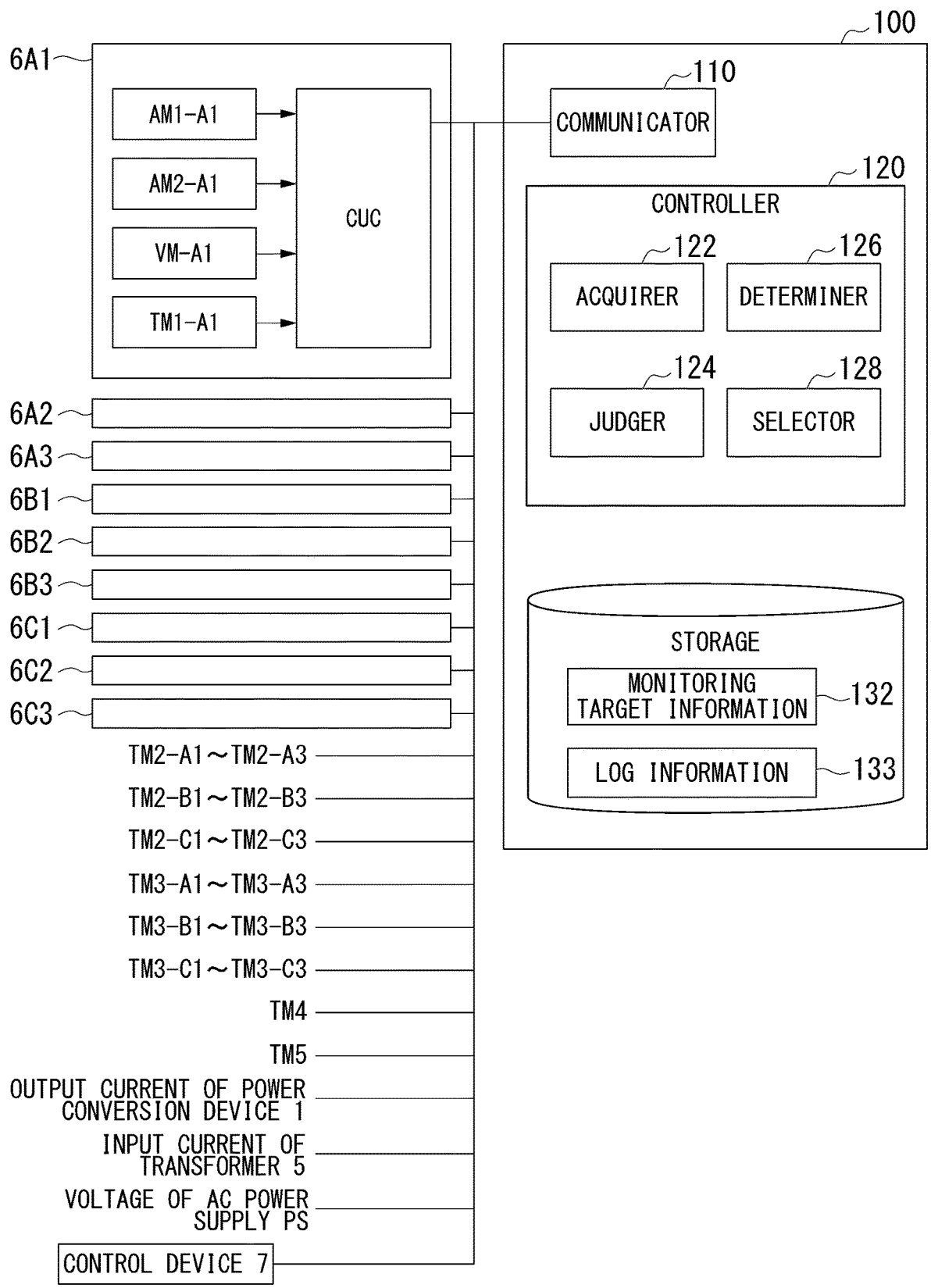
FIG. 5 is a diagram showing one example of the configuration of a storage control device according to an embodiment.

FIG. 5 is a diagram showing one example of the configuration of the storage control device 100. As shown in FIG. 5, a communicator 110, a controller 120, and a storage 130 are included.

The communicator 110 communicates with a current sensor AM, a voltage sensor VM, a temperature sensor TM, and a control device 7 through a communication line such as a peripheral component interconnect (PCI). In addition, in the communicator 110, a part communicating with an external device of the power conversion device 1 through a network and a part communicating with an internal device of the power conversion device 1 through a communication line may be separate bodies. Signals of various sensors inside the cell unit 6 (for example, a current sensor AM1-A1, a current sensor AM2-A1, a voltage sensor VM-A1, a temperature sensor TM1-A1, and the like) are transmitted to the communicator 110 through a cell unit controller CUC. In addition, signals of temperature sensors TM2 to TM5 that are not disposed inside the cell unit, an output current of the power conversion device 1, an input current of the transformer 5, and a voltage of the AC power supply PS (the primary-side voltage of the transformer 5) may be directly transmitted to the communicator 110 for communication as shown in FIG. 5 or may be transmitted through the control device 7.

The controller 120, for example, includes an acquirer 122, a judger 124, a determiner 126, and a selector 128. The controller 120, for example, may be realized by a processor such as a central processing unit (CPU) executing a program stored in the storage 130. In addition, the controller 120 may be realized by hardware such as a large scale integration (LSI), an application specific integrated circuit (ASIC), a field-programmable gate array (FPGA), or the like or may be realized by cooperation between software and hardware. Details of each functional unit will be described later.

The storage 130, for example, may be realized by a read only memory (ROM), a flash memory, a hard disk drive (HDD), an SD card, a magneto resistive random access memory (MRAM), a random access memory (RAM), an electrically erasable and programmable read-only memory (EEPROM) register, or the like. The storage 130 stores a program executed by the processor of the controller 120, monitoring target information 132, and log information 134.

<3.2 Various Kinds of Information>
<3.2.1 Monitoring Target Information>

FIG. 6 is a diagram showing one example of details of monitoring target information 132. As shown in FIG. 6, in the monitoring target information 132, for example, a record in which information representing a signal supply source, information representing a measurement target for which a measurement signal is measured or control target of a control signal, information representing an acquisition interval of measurement signals acquired from the signal supply source or control signals, and information representing a storage time for storing the acquired measurement signals or control signals are associated with each other and identification information (an ID shown in the drawing) used for identifying the record are included. The signal supply source, for example, is information representing a component (device) by which the voltage sensor VM, the current sensor AM, or the temperature sensor TM supplying a measurement signal measures a voltage, a current, or a temperature and a cell unit in the power conversion device 1 or the control device 7 supplying a control signal. A measurement target, for example, is a measurement target of which the voltage is measured by the voltage sensor VM, a measurement target of which the current is measured by the current sensor AM, or a measurement target of which the temperature is measured by the temperature sensor TM. In the following description, in a case in which a measurement signal and a control signal do not need to be differentiated from each other, they will be collectively referred to as "signals." The voltage sensor VM, the current sensor AM, the temperature sensor TM, or the control device 7 that is a signal supply source represented in the monitoring target information 132 is one example of a "first sensor." In addition, the storage time represented in the monitoring target information 132 is one example of a "first period" and a "fourth period." Furthermore, the acquisition interval represented in the monitoring target information 132 is one example of a "first sampling cycle" and a "fourth sampling period." In addition, information represented by a signal supplied (acquired) from a signal supply source that is a "first sensor" is one example of "first monitoring item." Furthermore, a monitoring target in which the voltage sensor VM, the current sensor AM, the temperature sensor TM, or the control device 7 of the signal supply source that is represented in the monitoring target information 132 is installed is one example of a "first power converting unit."

<3.2.2 Log Information>

FIG. 7 is a diagram showing one example of contents of the log information 134. As shown in FIG. 7, the log information 134 is information in which information representing a value of a signal acquired from a signal supply source and date and time at which the signal has been acquired are associated with each other for each signal supply source under the control of the controller 120.

<3.3 Each Functional Unit Included in Controller>

The acquirer 122 acquires signals of a plurality of channels acquired from the current sensor AM, the voltage sensor, VM, the temperature sensor TM, or the control device 7 using the communicator 110. The signals of a plurality of channels are signals of which kinds (for example, a measurement signal of a current, a measurement signal of a voltage, a measurement signal of a temperature, or the like) are different from each other.

The judger 124 judges whether or not a predetermined change has occurred in the power conversion device 1 on the basis of acquired signals of a plurality of channels. Here, a predetermined change, for example, is a change representing a sign of a malfunction occurring in the power conversion device 1. A judgment condition under which the judger 124 judges that a predetermined change has occurred, for example, is (1) a condition that some or all of the signals of a plurality of channels exceed a predetermined threshold, (2) a condition that a predetermined relation between some or all of the signals among signals of a plurality of channels changes, (3) a condition that some or all of signals of a plurality of channels deviate from an average value of a plurality of signals, or the like.

The predetermined threshold in the judgment condition (1), for example, is a value in a state in which a sign of a malfunction has not occurred in the power conversion device 1 and is a value coinciding with a current measured by the current sensor AM in the state, a value coinciding with a voltage measured by the voltage sensor VM in the state, a value coinciding with a temperature measured by the temperature sensor TM in the state, a value of a control signal output from the control device 7 in the state, or the like. In a case in which the signal exceeds such a threshold, the judger 124 determines that the judgment condition (1) is satisfied.

The predetermined relation in the judgment condition (2), for example, is a relation between signals of the same channel in a state in which a sign of a malfunction has not occurred in the power conversion device 1. More specifically, the predetermined relation, for example, is a relation in a state in which a sign of a malfunction has not occurred in the power conversion device 1 and is a relation between heights of temperatures represented by measurement signals measured by the temperature sensors TM1 to TM3, a relation between magnitudes of voltages represented by measurement signals measured by voltage sensors VM of switching circuits, a relation between magnitudes of currents represented by measurement signals measured by current sensors AM, a relation between magnitudes of values represented by controls signals supplied from the control device 7, or the like. For example, in one example shown in FIG. 4, in a state in which a sign of a malfunction has not occurred, all the temperatures of an upper stage, an intermediate stage, and a lower stage have a relation of temperatures of the same degree (an upper stage temperature=an intermediate stage temperature=a lower stage temperature).

However, in a state in which a sign of a malfunction has occurred, the relation changes to a relation in which the temperature of a stage, in which a device in which the sign of the malfunction has occurred is installed, rises (a temperature of a stage in which a malfunction has occurred>temperatures of other stages). Accordingly, in a case in which a relation between heights of temperatures represented by measurement signals measured by the temperature sensors TM1 to TM3 changes, the judger 124 judges that the judgment condition (2) is satisfied.

The average value of a plurality of signals in the judgment condition (3), for example, is a value in a state in which a sign of a malfunction has not occurred in the power conversion device 1 and is an average value of currents measured by current sensors AM in the state, an average value of voltages measured by voltage sensors VM in the state, an average value of temperatures measured by temperature sensors TM in the state, an average value of control signals output from the control device 7 in the state, or the like. In a case in which some or all of signals of a plurality of channels deviate from an average value of a plurality of signals, the judger 124 judges that the judgment condition (3) has been satisfied.

A state in which a sign of a malfunction has not occurred in the power conversion device 1 (in other words, a normal state) is one example of a "first state," and a state in which a sign of a malfunction has occurred in the power conversion device 1 is one example of a "second state."

In a case in which it is judged by the judger 124 that a predetermined change has occurred, the determiner 126 determines (changes) details of the monitoring target information 132. A determination method for determining the monitoring target information 132 using the determiner 126, for example, is (A) a method of determining that a signal stored as the log information 134 among signals of a specific channel is changed, (B) a method of lengthening a time stored in the log information 134, (C) a method of shortening an acquisition interval at which a signal is acquired, or the like. In addition, the determination methods (A) to (C) used by the determiner 126 are examples, and thus the determination method is not limited thereto.

The determination method (A) to be described later is one example of a "third operation" and a "sixth operation." In addition, the determination method (B) to be described later is one example of a "second operation" and a "fifth operation." Furthermore, the determination method (C) to be described later is one example of a "first operation" and a "fourth operation." In addition, the determiner 126 is one example of a "second controller."

The selector 128 selects signals of a monitoring target among signals acquired by the acquirer 122 on the basis of the monitoring target information 132 determined by the determiner 126 and stores the selected signal as the log information 134.

<3.4 Operation of Storage Control Device>

FIG. 8 is a flowchart showing one example of the operation of the storage control device 100. The acquirer 122 acquires measurement signals from the current sensor AM, the voltage sensor VM, or the temperature sensor TM (Step S102). Next, the acquirer 122 acquires control signals of the power conversion device 1 from the control device 7 (Step S104). The processes of Step S102 and Step S104 may be executed simultaneously or in a reverse order.

Next, the judger 124 judges whether or not a predetermined change has occurred on the basis of the signals acquired by the acquirer 122 (Step S106). The judger 124, for example, judges whether or not signals of a plurality of channels acquired by the acquirer 122 satisfy the judgment conditions (1) to (3) for each channel. In a case in which at least any one of the judgment conditions (1) to (3) for determining that a predetermined change has occurred is satisfied, the judger 124 judges that the predetermined change has occurred, and the process proceeds to Step S108. In addition, in a case in which none of the judgment conditions (1) to (3) for judging that a predetermined change has occurred is not satisfied, the judger 124 judges that the predetermined change has not occurred, and the process proceeds to Step S110.

In a case in which two or more conditions among the judgment conditions (1) to (3) for judging that a predetermined change has occurred are satisfied compositely, the judger 124 may judge that the predetermined change has occurred.

In a case in which it is judged by the judger 124 that a predetermined change has occurred, the determiner 126 determines (changes) details of the monitoring target information 132 (Step S108). Details of a determination process of determining details of the monitoring target information 132 using the determiner 126 will be described later.

Next, the selector 128 selects signals of a monitoring target among the signals acquired by the acquirer 122 on the basis of the monitoring target information 132 determined by the determiner 126 and stores the selected signals as the log information 134 (Step S110). The selector 128, for example, causes the communicator 110 (the acquirer 122) to acquire signals of a monitoring target represented in the monitoring target information 132 on the basis of the acquisition interval represented in the monitoring target information 132 and stores the acquired signals only for the storage time represented in the monitoring target information 132. The selector 128, for example, realizes the process of storing signals only for the storage time represented in the monitoring target information 132 by overwriting information of signals that have been newly acquired into information of signals with which acquisition date and times older than (before) the storage time are associated. In such a case, the storage area of the log information 134, for example, is realized using a ring buffer according to the storage time and the amount of information of signals.

In addition, the communicator 110 (the acquirer 122) may acquire signals all the time. In such a case, the selector 128 selects signals coinciding with timings according to the acquisition interval represented in the monitoring target information 132 among signals acquired by the communicator 110 (the acquirer 122) and stores the selected signals as log information 134.

<3.5 Determination Process of Determiner>
<5.1 Example of Determination Process of Determination Method (A)>

Hereinafter, details of a determination process of (A) determining (changing) to change signals stored as the log information 134 among signals of a certain channel using the determiner 126 for signals in which it is judged by the judger 124 that a predetermined change has occurred will be described.

For example, the monitoring target information 132 are assumed to represent that measurement signals of the temperature sensor TM2 among temperature sensors TM1 to TM3 are stored as log information 134. In a case in which it is judged by the judger 124 that signals of a monitoring target (for example, the temperature sensor TM1) different from the monitoring target represented in the monitoring target information 132 until now satisfy the judgment condition (1), the determiner 126 adds monitoring target information 132 such that the signals that have been judged to satisfy the judgment condition (1) are stored as log information 134. In addition, in accordance with storing of new signals (in this case, measurement signals acquired from the temperature sensor TM1) as the log information 134, signals that have been stored until now (in this case, measurement signals acquired from the temperature sensor TM2) are deleted from the monitoring target information 132. In this way, the storage control device 100 can store information of a monitoring target in which a sign of a malfunction has occurred in the log information 134.

The voltage sensor VM, the current sensor AM, the temperature sensor TM, or the control device 7 that is a signal supply source that has been newly added to the monitoring target information 132 by executing the determination method (A) using the determiner 126 is one example of a "second sensor." In addition, a storage time associated with the "second sensor" is one example of a "third period." The "third period" is a period shorter than the "first period" described above. In addition, an acquisition interval associated with the "second sensor" is one example of a "third sampling period." The "third sampling period" is a period shorter than the "first sampling cycle" described above. In addition, information represented by signals supplied (acquired) from a signal supply source that is the "second sensor" is one example of "second monitoring details." In addition, a monitoring target in which the voltage sensor VM, the current sensor AM, the temperature sensor TM, or the control device 7 of the signal supply source represented in the monitoring target information 132 is one example of a "second power converting unit."

<3.5.2 Example of Determination Process of Determination Method (B)>

Hereinafter, details of a determination process of (B) determining (changing) to lengthen a time for which signals in which it is judged by the judger 124 that a predetermined change has occurred are stored in the log information 134 using the determiner 126 will be described.

For example, in a case in which a malfunction has occurred in the power conversion device 1, and a cause of the malfunction is to be probed, it is preferable that information a longer time before a timing at which the malfunction has occurred is stored in the log information 134. The determiner 126 changes the storage time of the monitoring target information 132 to be longer such that signals judged to satisfy the judgment condition (1) is stored for a longer time.

Here, when a storage time of signals of which the acquisition interval is short is lengthened (in other words, signals having large changes within a predetermined time), there are cases in which the amount of data of the log information 134 occupying the storage capacity of the storage 130 increases, and the storage capacity of the storage 130 becomes insufficient. For this reason, the determiner 126, for example, calculates an available capacity of the storage 130 on the basis of an acquisition interval of another signal represented in the monitoring target information 132, the amount of data of the signals, and the storage time of the signals. In addition, the determiner 126 changes the monitoring target information 132 such that the storage time is lengthened by only a time for which the signals can be stored using the calculated available capacity. In this way, the storage control device 100 can store information of a monitoring target in which a sign of a malfunction has occurred for a longer time in the log information 134.

In addition, even in a case in which it is judged that a predetermined change has occurred, the determiner 126 may not perform changing of lengthening the storage time of the monitoring target information 132 in a case in which the acquisition interval of the signals represented in the monitoring target information 132 is short.

Furthermore, the determiner 126 may shorten storage times of other signals other than the signals in which it is judged that a predetermined change has occurred or set the storage times of the other signals to "0" (in other words, stop storage) and lengthen the storage time of signals in which it is judged that the predetermined change has occurred on the basis of the monitoring target information 132. In addition, the determiner 126 may lengthen acquisition intervals of other signals other than signals in which it is judged that a predetermined change has occurred and lengthen the storage time of the signals in which it is judged that the predetermined change has occurred on the basis of the monitoring target information 132.

A storage time associated with a "first sensor" in which a predetermined change has occurred in accordance with execution of the determination method (B) using the determiner 126 that is the storage time changed to be lengthened is one example of a "second period." The "second period" is a period longer than the "first period" described above.

In addition, the voltage sensor VM, the current sensor AM, the temperature sensor TM, or the control device 7 of which the acquisition period is changed to be lengthened or the storage time is changed to be shortened in accordance with changing of the storage time of the "first sensor" to the "second time" by executing the determination method (B) using the determiner 126 is one example of a "third sensor." The process of changing the acquisition period to be lengthened using the determiner 126 is one example of a "fourth operation." The process of changing the storage time to be shortened using the determiner 126 is one example of a "fifth operation." An operation of setting the storage time to "0" (in other words, stopping storage) using the determiner 126 is one example of a "sixth operation."

In addition, a storage time associated with a "third sensor" in advance is one example of a "fourth period," and a storage time after change according to the determination method (B) is one example of a "fifth period." The "fifth period" is shorter than the "fourth period." In addition, an acquisition interval associated with the "third sensor" in advance is one example of a "fourth sampling period," and an acquisition period after change according to the determination method (B) is one example of a "fifth sampling period." The "fifth sampling period" is a period shorter than the "fourth sampling period" described above. In addition, information represented by a signal supplied (acquired) from a signal supply source that is the "third sensor" is one example of "third monitoring details."

<3.5.3 Example of Determination Process of Determination Method (C)>

Hereinafter, details of a determination process of (C) determining (changing) an acquisition interval at which signals in which it is judged by the judger 124 that a predetermined change has occurred using the determiner 126 will be described.

For example, in a case in which a malfunction has occurred in the power conversion device 1, and a cause of the malfunction is to be probed, it is preferable that more detailed information is stored in the log information 134 (in other words, the number of acquired signals within a predetermined time is large). The determiner 126 changes the acquisition interval of the monitoring target information 132 to be shortened such that signals judged to satisfy the judgment condition (1) are stored more finely.

Here, even in a case in which information of signals of which a change within a predetermined time is small (for example, measurement signals acquired by measuring the temperature and the like) is stored more finely by shortening the acquisition interval, it may not be helpful for probing causes of the malfunction that has occurred and the like. For this reason, the determiner 126, for example, changes the monitoring target information 132 such that an acquisition interval of signals having a large change within a predetermined time among signals represented in the monitoring target information 132 is shortened. In this way, the storage control device 100 can store information of a monitoring target in which a sign of a malfunction has occurred in the log information 134 in more detail.

An acquisition interval that is associated with the "first sensor" that is a signal supply source stored in the monitoring target information 132 in advance and is a shortened acquisition interval by executing the determination method (C) using the determiner 126 is one example of a "second sampling cycle." The "second sampling cycle" is a period shorter than the "first sampling cycle" described above.

<3.5.4 Example of Determination Process of Determination Method (A) and (B)>

In addition, for example, the judger 124 derives the average temperature of the temperature sensors TM1 to TM3 of each cell unit 6 and judges whether or not the derived average temperature exceeds a predetermined threshold. In a case in which it is judged by the judger 124 that the derived average temperature exceeds a predetermined threshold (in other words, the judgment condition (1) is satisfied), the determiner 126 executes the determination method (A), the determination method (B), and the determination method (C). In this case, according to the determination method (A), the acquisition of the cell unit 6 of which information of the temperature sensor TM has been acquired until now in the monitoring target information 132 is stopped, and a storage time of the cell unit 6 of which the average temperature exceeds a predetermined threshold is changed from 1250 [s] to 2500 [s].

In addition, for example, the determiner 126 executes the determination method (A), the determination method (B), and the determination method (C) for a cell unit 6 that was stopped due to a cell unit abnormality in the past and is a cell unit 6 that has returned using an automatic retry function. In this case, according to the determination method (A), acquisition of a cell unit 6 of which information has been acquired until now in the monitoring target information 132 is stopped, and information of a cell unit 6 that has returned using the automatic retry function is acquired.

In this way, the power conversion device 1 can change an acquisition target to information of a monitoring target in which a sign of a malfunction has occurred.

<3.5.5 Example of Determination Process of Determination Methods (B) and (C)>

For example, the judger 124 derives a difference $\Delta irip1$ between a maximum value and a minimum value for each phase on the basis of an output current from each cell unit 6 to the load L and a fundamental wave current component of the output current to the load L and judges whether or not the derived difference $\Delta irip1$ has exceeded a predetermined threshold. In a case in which it is judged by the judger 124 that the difference $\Delta irip1$ has exceeded a predetermined threshold (in other words, the judgment condition (1) is satisfied), the determiner 126 executes the determination method (B) and the determination method (C). In this case, according to the determination method (B), an acquisition interval is changed from 5 [kHz] to 10 [kHz], and, according to the determination method (C), a storage time is changed from 500 [ms] to 250 [ms].

For example, the judger 124 derives an average temperature of the temperature sensors TM1 to TM3 of each cell unit 6 and determines whether or not some or all of the derived average temperatures deviate from an average value of a plurality of signals. In a case in which it is judged by the judger 124 that some or all of the average temperatures deviate from the average value of the plurality of signals (in other words, the judgment condition (3) is satisfied), the determiner 126 executes the determination method (B) and the determination method (C). In this case, according to the determination method (B), an acquisition interval is changed from 1 [Hz] to 0.5 [Hz], and, according to the determination method (C), a storage time is changed from 1250 [s] to 2500 [s].

As described above, by executing the determination method (B) and the determination method (C) using the determiner 126, the power conversion device 1 can inhibit an increase in the amount of data of information occupying the storage capacity of the storage 130 while storing the information of a monitoring target in which a sign of a malfunction has occurred in more details.

<3.5.6 Example of Determination Process of Determination Methods (A), (B), and (C)>

In addition, for example, the judger 124 derives a difference $\Delta irip2$ between an output current from each cell unit 6 to the load L and a fundamental wave current component of the output current to the load L for each phase and judges whether or not some or all of the derive differences $\Delta irip2$ deviate from an average value of a plurality of signals. In a case in which it is judged by the judger 124 that some or all of the derived differences $\Delta irip2$ deviate from the average value of the plurality of signals (in other words, the judgment condition (3) is satisfied), the determiner 126 executes the determination method (A), the determination method (B), and the determination method (C). In this case, according to the determination method (A), an acquisition interval of the cell unit 6 from which various kinds of information has been acquired until now is changed from 5 [kHz] to 10 [kHz], a storage time thereof is changed from 250 [ms] to 500 [ms], an acquisition interval of the cell unit 6 of which the difference $\Delta irip2$ is a maximum is changed from 10 [kHz] to 5 [kHz], and a storage time thereof is changed from 250 [ms] to 500 [ms] in the monitoring target information 132. In this way, the power conversion device 1 can change the information to information of a monitoring target in which a sign of a malfunction has occurred.

<3.5.4 Other Determination Process: Inhibition of Deviation of Monitoring Target Information>

In addition, it is preferable that the determiner 126 selects information with which the same channel as that of a signal in which an occurrence of a predetermined change is judged is associated from the monitoring target information 132 and changes the monitoring target information 132 by changing the selected information. In this way, the storage control device 100 can inhibit details of the log information 134 from deviating to details of a specific channel.

<3.5.5 Other Determination Process: Storage of Surrounding Monitoring Target>

In addition, other than a signal in which an occurrence of a predetermined change is judged, the determiner 126 may change the monitoring target information 132 such that a signal of a monitoring target disposed at a physically close position from the voltage sensor VM, the current sensor AM, or the temperature sensor TM supplying the signal is stored as the log information 134. In this way, the storage control device 100 can store a monitoring target in which a sign of a malfunction has occurred and peripheral information of the monitoring target as the log information 134.

<3.5.6 Other Determination Process: Storage of Malfunctioning Site>

In addition, in a case in which a malfunction has occurred in the power conversion device 1, the determiner 126 may change the monitoring target information 132 of the determination method (A) such that the malfunctioning monitoring target is included in the monitoring target information 132 after malfunctioning. In addition, the determiner 126 may perform any one of the determination methods (B) and (C) for a signal supplied by a signal supply source of the malfunctioning monitoring target. In this way, the storage control device 100 can check the progress of the monitoring target in which a malfunction has occurred once. In this case, a restoring operation after the malfunction or an emergent stopping signal (alert) accompanying the malfunction is one example of a "predetermined action."

While several embodiments of the present invention have been described, such embodiments are presented as examples and are not for the purpose of limiting the scope of the invention. These embodiments may be executed in other various forms, and various omissions, substitutions, and changes may be made in a range not departing from the concept of the invention. These embodiments and modifications thereof similarly belong to the scope of the invention described in the claims and a scope equivalent thereto as long as they are included in the range and the concept of the invention.

REFERENCE SIGNS LIST

1 Power conversion device
5 Input transformer
6 Cell unit
6A Cell unit of first phase
6B Cell unit of second phase
6C Cell unit of third phase
7 Control device
12 Converter
13 Inverter
20 Casing
21 Opening portion
22 Front-face cover
22a Ventilation part
23 Shelf board
24 Housing part
25 First partition member
26 Second partition member
27 Fan
100 Storage control device
110 Communicator
120 Controller
122 Acquirer
124 Judger
126 Determiner
128 Selector
130 Storage
132 Monitoring target information
134 Log information
AM, AM1, AM2, AM3 Current sensor
VM Voltage sensor
N Negative electrode
P Positive electrode C Neutral point
CUC Cell unit controller
L Load
PS AC power supply
TM, TM1, TM2, TM3 Temperature sensor

What is claimed is:

1. A power conversion device comprising:
a cell unit configured to supply AC power having a variable frequency to an electric motor;
a first sensor provided for the cell unit, the first sensor being configured to measure and output a value relating to a first monitoring item of the cell unit;
a second sensor provided for the cell unit, the second sensor being configured to measure and output a value relating to a second monitoring item of the cell unit;
a storage;
a first controller configured to monitor an output result of the first sensor and an output result of the second sensor and to control or protect the cell unit on the basis of at least one of the output result of the first sensor and the output result of the second sensor;
an acquirer configured to acquire the output result of the first sensor from the first sensor, the output result of the second sensor from the second sensor, and control signals from the first controller;
a judger configured to judge whether or not a predetermined change has occurred on the basis of the output result of the first sensor, the output result of the second sensor, and the control signals which are acquired by the acquirer;
a second controller configured to determine a determination method indicating how to store the output result of the first sensor, the output result of the second sensor, and the control signals in the storage when the judger judges that the predetermined change has occurred, wherein
the determination method includes a first operation, a second operation, and a third operation, and
the second controller is configured to, by determining the determination method, in a case in which the cell unit is in a first state, store the output result of the first sensor measured at each first sampling cycle in the storage over at least a first period without storing the output result of the second sensor in the storage, and configured to, in a case in which the cell unit transitions to a second state in which a change in at least one of the output result of the first sensor and the output result of the second sensor satisfies a first condition, execute at least one of the first operation of storing the output result of the first sensor measured at each second sampling cycle shorter than the first sampling cycle in the storage, the second operation of storing the output result of the first sensor in the storage over second period longer than the first period, and the third operation of storing the output result of the second sensor in the storage instead of the output result of the first sensor.

2. The power conversion device according to claim 1, wherein the second controller is configured to execute the first operation in a case in which the cell unit transitions to the second state.

3. The power conversion device according to claim 1, wherein the second controller is configured to execute the second operation in a case in which the cell unit transitions to the second state.

4. The power conversion device according to claim 1, wherein the second controller is configured to execute at least one of the first operation and the second operation in a case in which a change in the output result of the first sensor satisfies the first condition.

5. The power conversion device according to claim 1, wherein
the cell unit includes a first power converter and a second power converter,
the first sensor is provided for the first power converter,
the second sensor is provided for the second power converter, and
the second controller is configured to execute at least one of the first operation and the second operation in a case in which a predetermined action representing a sign of a malfunction relating to the first power converter is occurred.

6. The power conversion device according to claim 1, wherein the second controller is configured to execute the third operation in a case in which the cell unit transitions to the second state.

7. The power conversion device according to claim 1, wherein the second controller is configured to execute the third operation in a case in which a change in the output result of the second sensor satisfies the first condition.

8. The power conversion device according to claim 1, further comprising
a plurality of sensors including the first sensor and the second sensor,
wherein the second controller is configured to execute the third operation in a case in which a deviation of values relating to the second monitoring item measured by the second sensor with respect to an average value of values measured by the plurality of sensors is larger than a deviation of values relating to the first monitoring item measured by the first sensor with respect to the average value.

9. The power conversion device according to claim 1, wherein the second controller is configured to execute the third operation in a case in which a value relating to the second monitoring item measured by the second sensor exceeds a value relating to the first monitoring item measured by the first sensor.

10. The power conversion device according to claim 1, wherein the second controller is configured to execute, as the third operation, at least one of an operation of storing the output result of the second sensor measured at each third sampling cycle shorter than the first sampling cycle in the storage and an operation of storing the output result of the second sensor in the storage over a third period longer than the first period.

11. The power conversion device according to claim 1, wherein
the cell unit includes a first power converter and a second power converter,
the first sensor is provided for the first power converter,
the second sensor is provided for the second power converter, and
the second controller is configured to execute the third operation in a case in which a predetermined action representing a sign of a malfunction relating to the second power converter is occurred.

12. The power conversion device according to claim 1, wherein
the cell unit includes a first power converter and a second power converter, the first converter being configured to convert power relating to a first phase of the AC power, the second power converter being configured to convert power relating to a second phase of the AC power, the first sensor is provided for the first power converter, and the second sensor is provided for the second power converter.

13. The power conversion device according to claim 1, further comprising a third sensor provided for the cell unit, the third sensor being configured to measure and output a value relating to a third monitoring item of the cell unit, wherein the determination method further includes a fourth operation, a fifth operation, and a sixth operation, the first controller monitors an output result of the third sensor in addition to the output result of the first sensor and the output result of the second sensor, and the second controller is configured to, by determining the determination method, store the output result of the third sensor measured at each fourth sampling cycle in the storage over at least a fourth period in a case in which the cell unit is in the first state, and configured to, in a case in which the cell transitions to the second state, execute at least one of the fourth operation of storing the output result of the third sensor measured at each fifth sampling cycle longer than the fourth sampling cycle in the storage, fifth operation of storing the output result of the third sensor in the storage over a fifth period shorter than the fourth period, and the sixth operation of stopping storing of the output result of the third sensor.

* * * * *